United States Patent [19]

Khamare et al.

[11] 4,403,213
[45] Sep. 6, 1983

[54] POWER SUPPLY DIAGNOSTIC SYSTEM

[75] Inventors: Ishwar S. Khamare, Fern Park; Rodney V. Hamilton, Orlando, both of Fla.

[73] Assignee: NCR Corporation, Dayton, Ohio

[21] Appl. No.: 242,520

[22] Filed: Mar. 11, 1981

[51] Int. Cl.³ .................... G08B 21/00; H02H 3/04
[52] U.S. Cl. .................... 340/517; 340/525; 340/661; 361/79; 361/87; 363/56
[58] Field of Search ............ 340/635, 661, 662, 663, 340/664, 500, 501, 510, 506, 507, 517, 518, 529, 340/519, 523, 525; 361/18, 79, 87; 363/53, 56

[56] References Cited

U.S. PATENT DOCUMENTS 3,808,534  4/1974  Summers et al. ............... 340/661 X

FOREIGN PATENT DOCUMENTS 2914840  10/1979  Fed. Rep. of Germany ...... 340/661

Primary Examiner—John W. Caldwell, Sr.
Assistant Examiner—Daniel Myer
Attorney, Agent, or Firm—J. T. Cavender; Wilbert Hawk, Jr.; Richard W. Lavin

[57] ABSTRACT

A digital controller used in regulating the output of a power supply including a diagnostic circuit for sensing the failure of a component in the power supply. Upon the occurrence of a fault, signals are generated locating the component which caused the shutdown of the power supply. The fault signals are inputted into a plurality of encoders which determine the priority between two or more simultaneous occurring faults and which further outputs binary signals identifying the faulty component. The binary signals are then latched and displayed in a LED display which may be actuated any time after the fault has occurred by the operation of a switch member.

11 Claims, 21 Drawing Figures

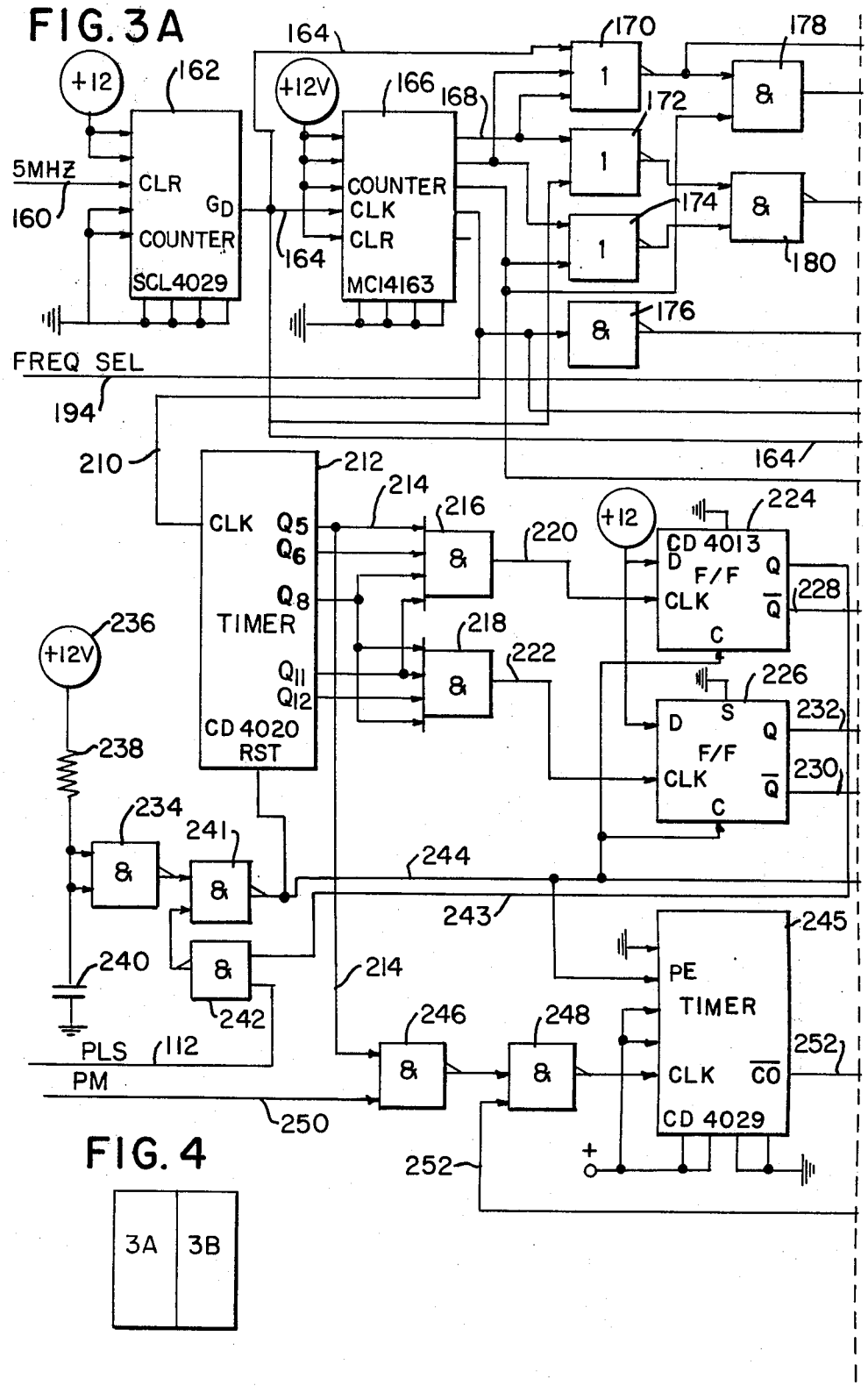
FIG. 3A
FIG. 4
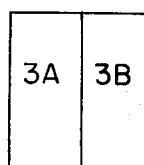

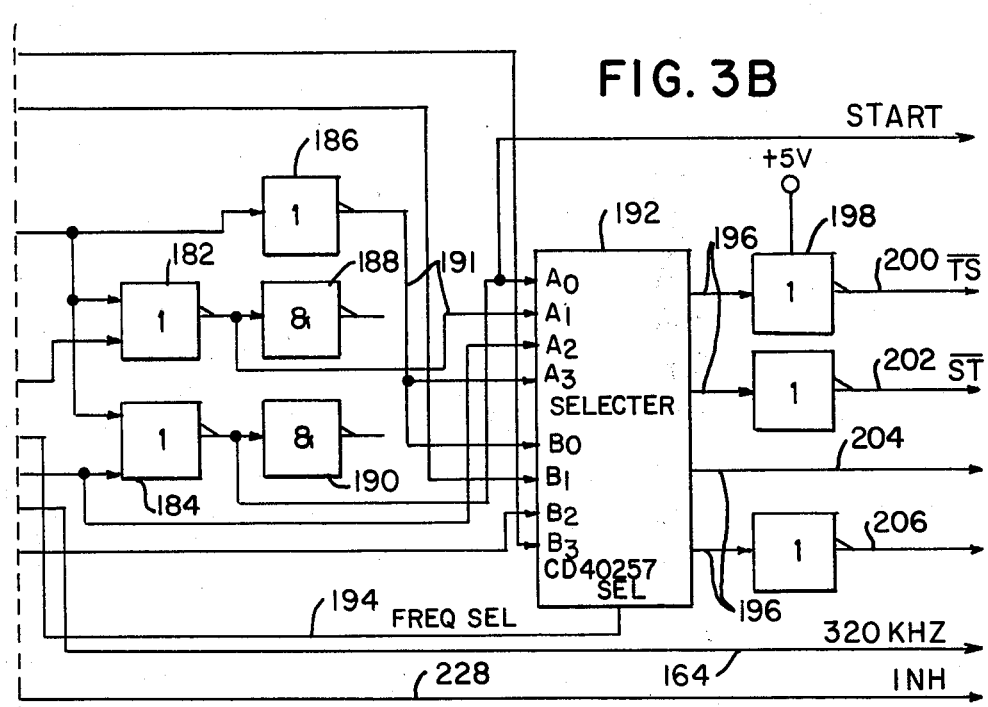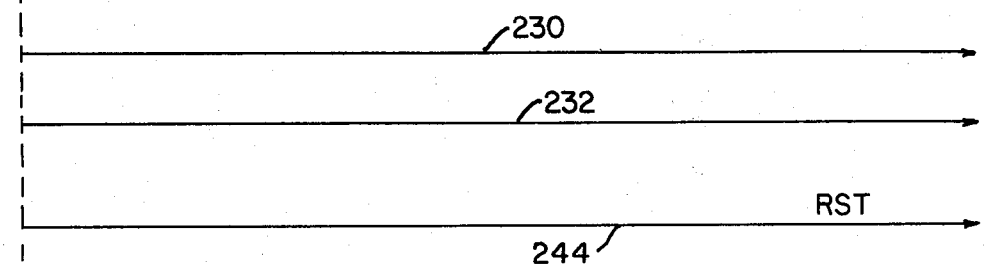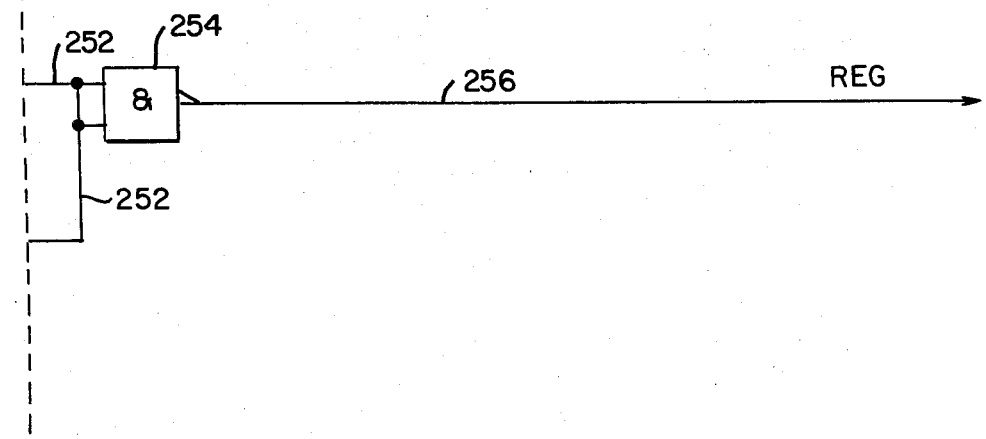

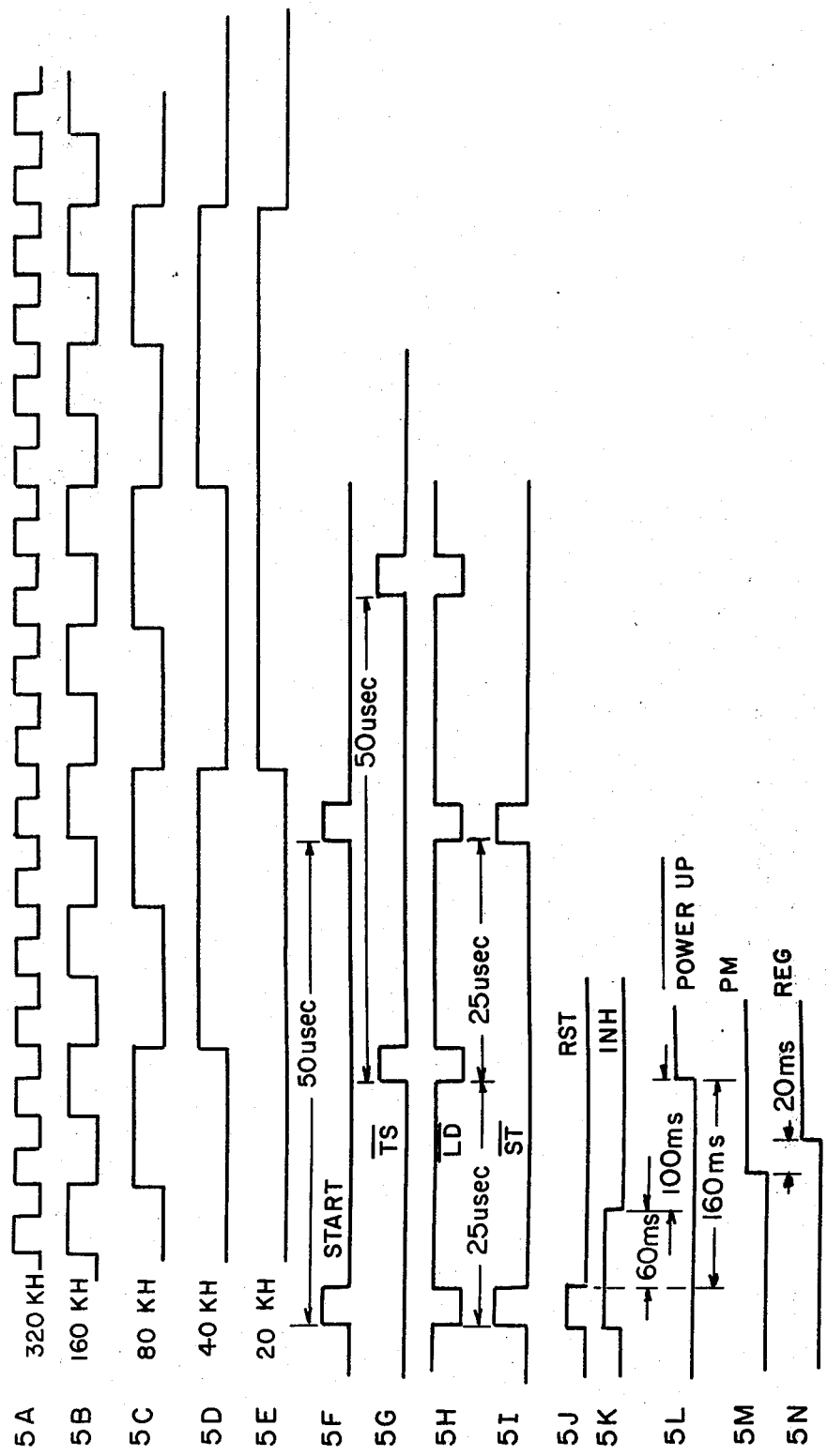

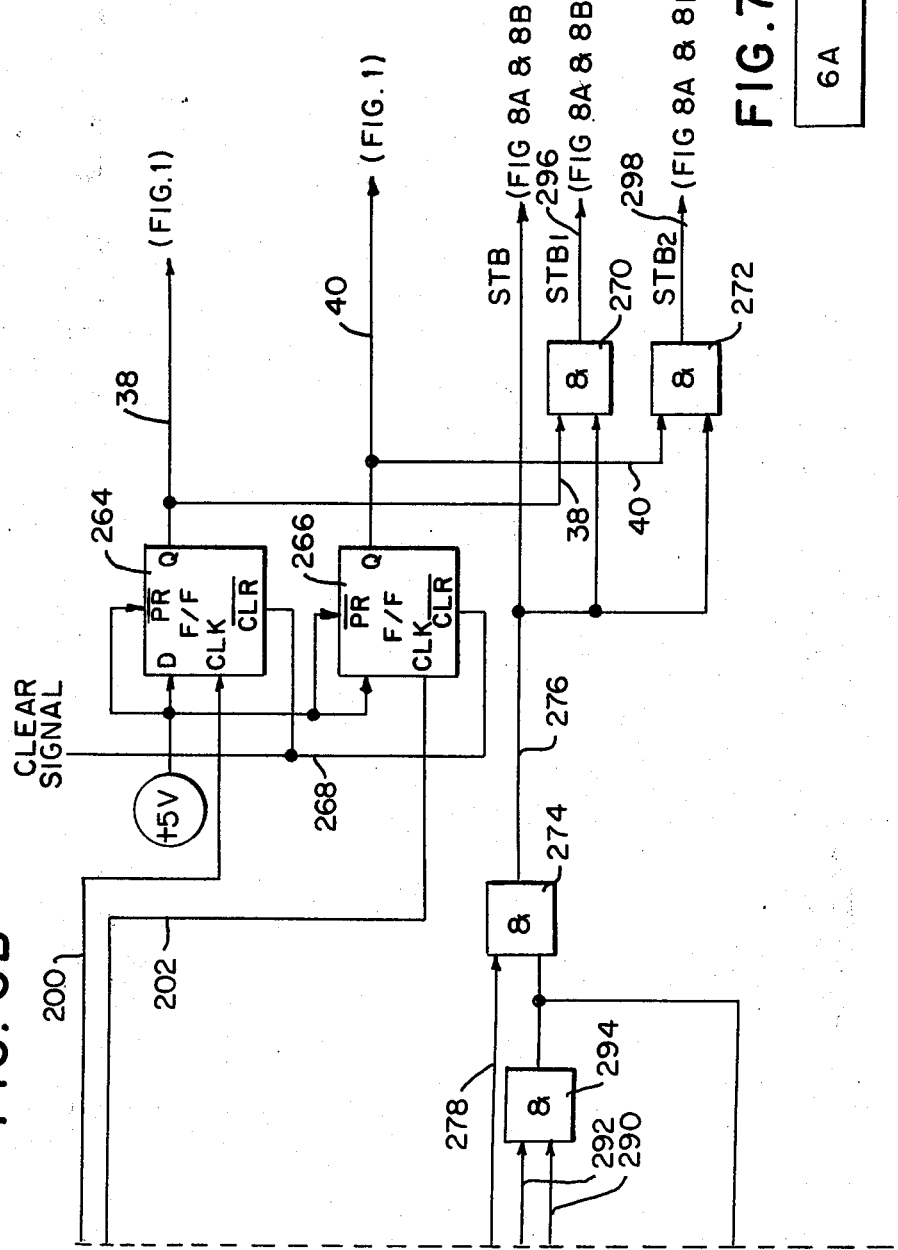

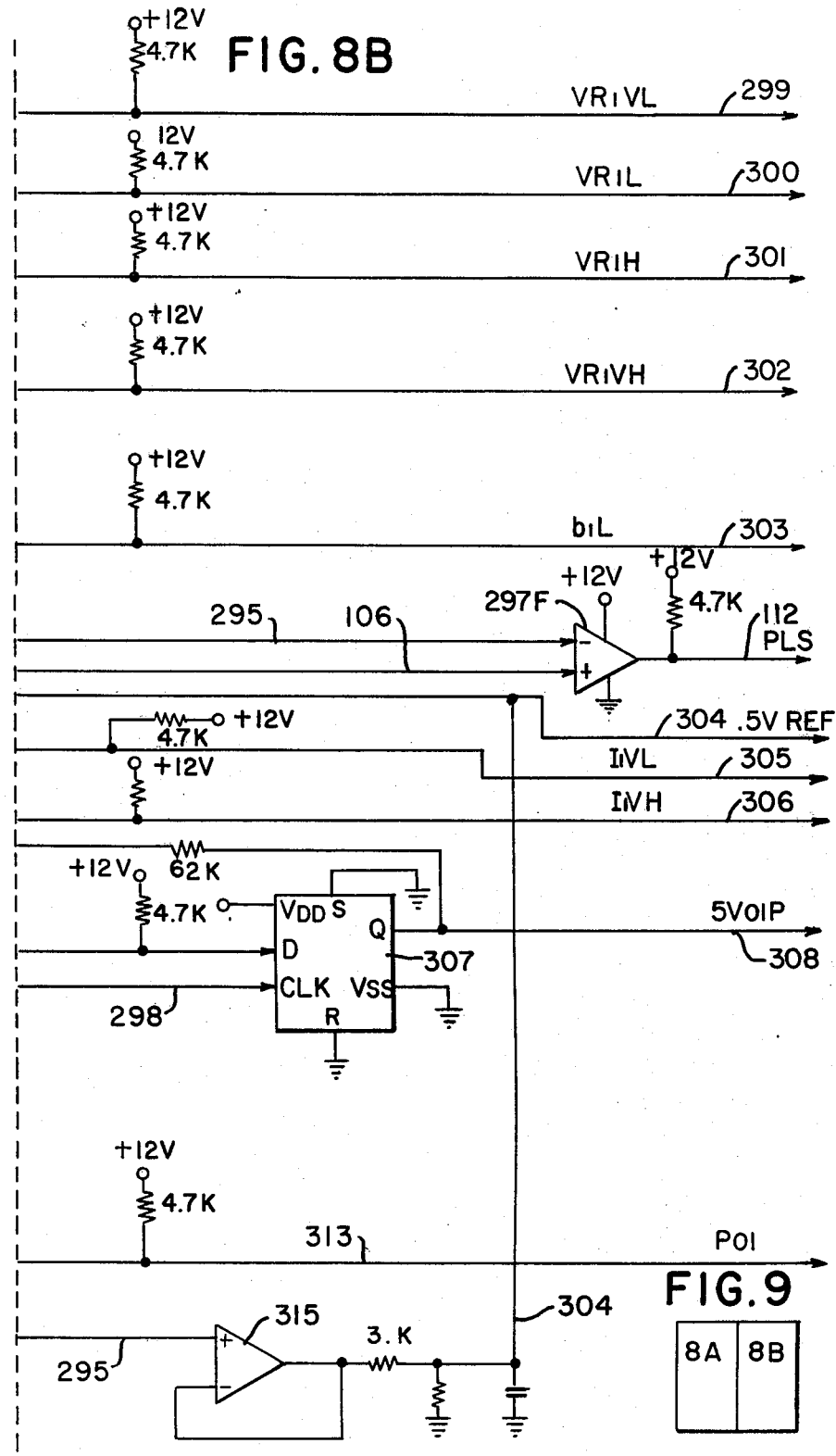

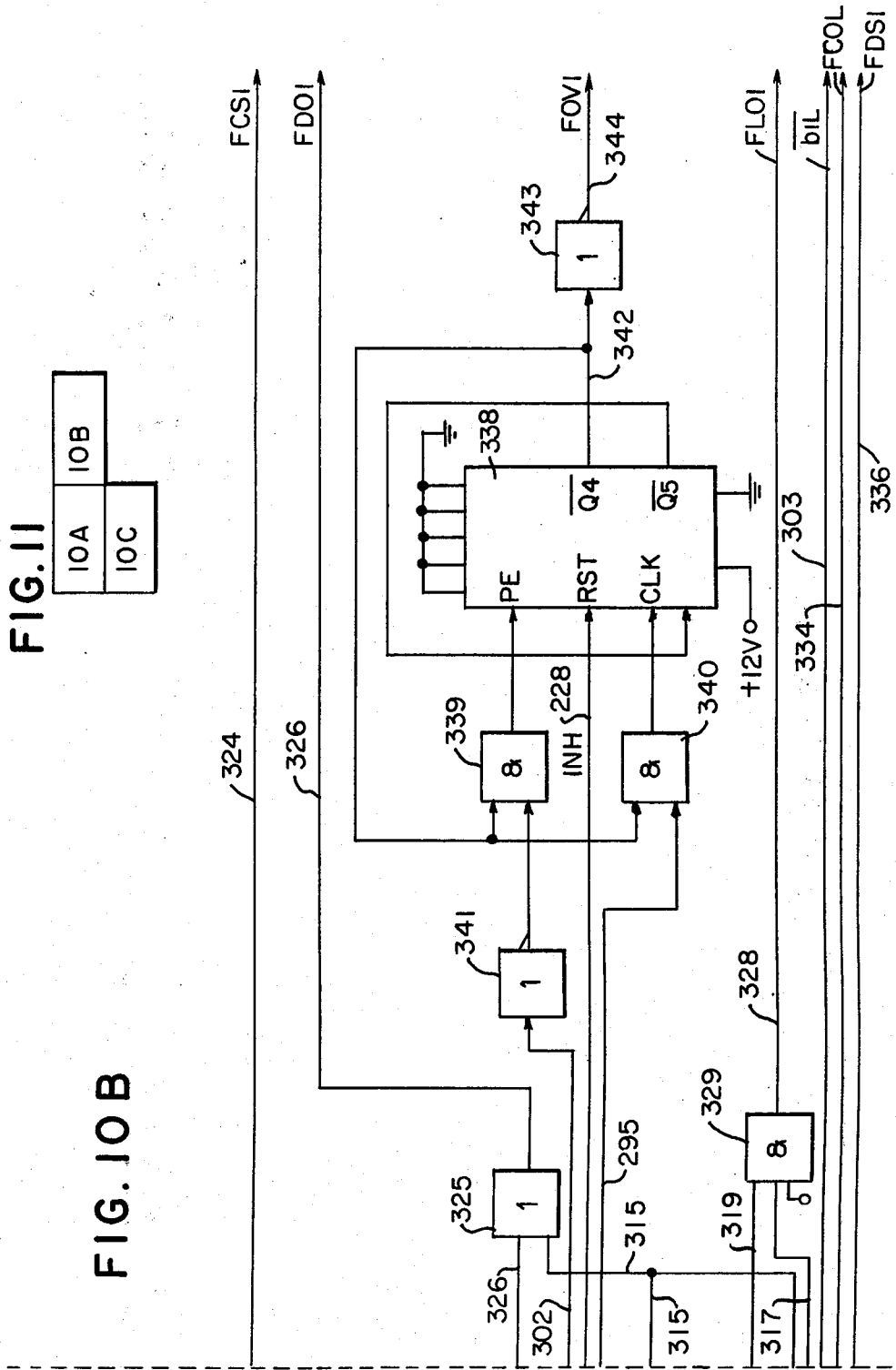

POWER SUPPLY DIAGNOSTIC SYSTEM

CROSS-REFERENCE TO RELATED APPLICATIONS

Digital controller, co-pending application Ser. No. 242,788, now U.S. Pat. No. 4,356,542, filed on even date herewith, invented by Ronald L. Bruckner, Ishwar S. Khamare, Joseph L. Voyer, Rodney V. Hamilton and Paul Gheorghiu.

BACKGROUND OF THE INVENTION

The present invention relates to power supplies in general and more particularly relates to a digital controller which can operate in a diagnostic mode to identify a defective element in the power supply.

Traditionally, off-line analog switching regulators designs have resulted in a high component count which adversely affects the reliability, package size and overall cost. Analog feedback control systems experience both short and long-term stability problems because of component drift. Secondly, each output voltage to be regulated requires a dedicated analog control system. This means that power systems which produce multiple, independent, regulated output voltages must have an independent analog controller for each voltage, since many contemporary applications require three to five independent voltages, duplicated analog circuitry contributes significantly to the cost of their power systems. Analog systems are not flexible enough to adapt to widely varying applications.

Present analog methods and power system architecture do not lend themselves to elaborate protection schemes and self-diagnostics to a sub-module level. It is therefore an object of this invention to provide a system controller for a power supply which is digital in construction and which senses the catastrophic failure of operating elements in the power system. It is another object of this invention to provide a digital controller for a power supply which will identify which operating element has failed. It is a further object of this invention to provide a digital constructed power supply controller incorporated into an LSI chip which provides a lower maintenance cost for the power system in which the controller is associated.

SUMMARY OF THE INVENTION

In order to carry out these objects, there is disclosed a digital controller which monitors each of the elements in the power system, and upon the failure of a system element detects the magnitude of the failure as to whether the system should be shut down. When the system is shut down, an LED display activated by a serviceman or the controller, will provide a serial readout identifying the element causing the shutdown.

BRIEF DESCRIPTION OF THE DRAWINGS

Additional advantages and features of the present invention will become apparent and fully understood from a reading of the following description, taken together with the annexed drawings, in which:

FIGS. 3A and 3B taken together disclose the logic circuits for generating the timing and clock signals used by the digital controller in a diagnostic mode of operation;

FIG. 4 is a diagram showing the manner in which FIGS. 3A and 3B are arranged with respect to each other to form the logic circuits.

FIG. 5A shows various waveshapes associated with the preferred embodiment.

FIGS. 6A and 6B taken together disclose the logic circuits for generating strobe pulses used in the diagnostic mode of the controller.

FIG. 7 is a diagram showing the manner in which FIGS. 6A and 6B are arranged with respect to each other to form the logic circuits.

FIG. 8A and 8B taken together disclose the logic circuits for generating the signals representing the voltage level at various points of the power supply.

FIG. 9 is a diagram showing the manner in which FIGS. 8A and 8B are arranged with respect to each other to form the logic circuits.

FIGS. 10A–10C inclusive taken together disclose the logic circuits for recognizing the element in which a fault has occurred.

FIG. 11 is a diagram showing the manner in which FIGS. 10A–10C are arranged with respect to each other to form the logic circuits.

FIG. 13 is a diagram showing the manner in which FIGS. 11A and 11B are arranged with respect to each other to form the logic circuits.

DESCRIPTION OF THE PREFERRED EMBODIMENT

Figure 1A:
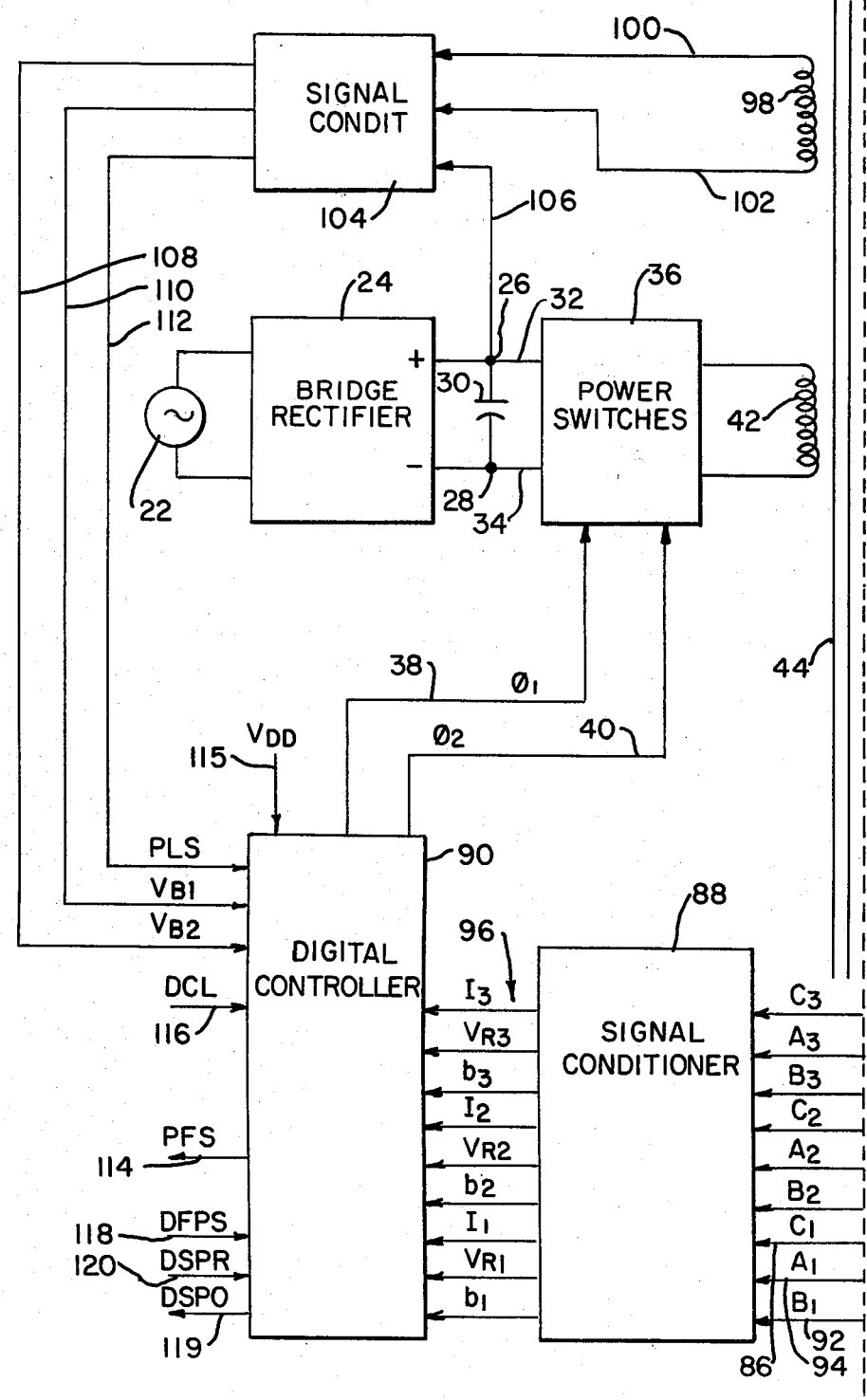
FIGS. 1A and 1B taken together disclose a block diagram of the power supply system which includes the digital controller of the present invention showing the output voltage levels of the system.
Figure 1B:
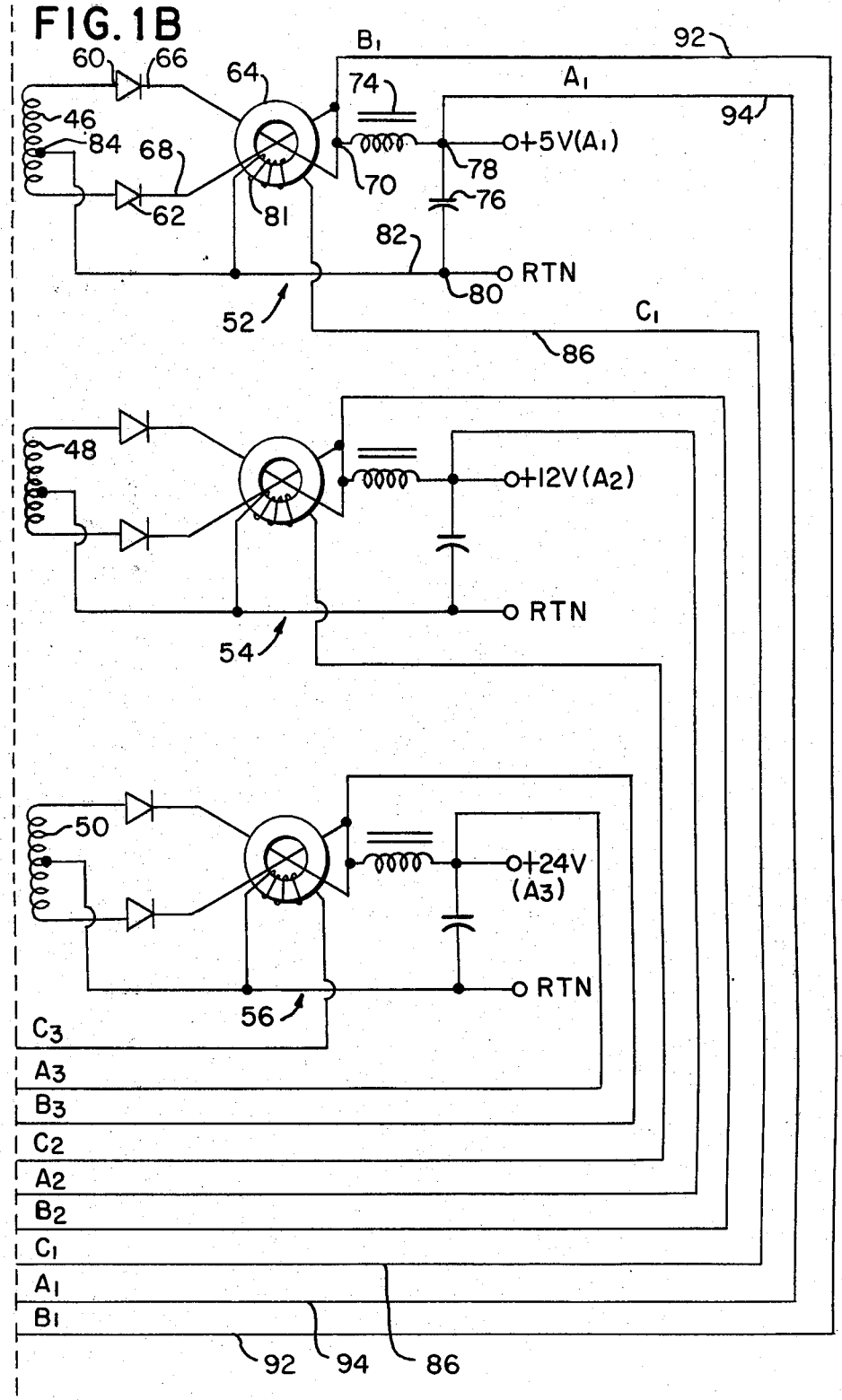

Referring now to FIGS. 1A and 1B, there is shown a partial diagram and schematic of a regulated power supply which incorporates digital devices including the digital controller of the present invention. A power supply, which is generally designated by the numeral 20, includes an AC input 22 (FIG. 1A) coupled to a conventional full wave bridge rectifier which provides a D.C. output at the positive and negative terminals 26 and 28, respectively. The terminals 26 and 28 are shunted by a filter capacitor 30 in a manner that is well-known in the art. Connected to the terminals 26 and 28 by means of conductors 32 and 34 are conventional power switches 36 comprising switching transistors (not shown) which are operated by 180° out of phase switching control signals ∅1 and ∅2 appearing on the conductors 38 and 40 to alternately drive the upper and lower half winding of the primary windings 42 of the transformer 44. As fully disclosed in the previously cited co-pending application of Bruckner et al., Ser. No. 242,788, the regulation of the power supply output appearing at the primary windings 42 of the transformer 44 will be controlled by altering the duty cycle of the Q1 and Q2 control signals appearing on the conductors 38 and 40.

Associated with the transformer 44 are three secondary windings 46–50 inclusive (FIG. 1B), each associated with a power output circuit generally indicated by the numeral 52-56 inclusive. The circuits 52 will have a power output of 5 volts, the circuit 54 will output 12 volts, while the circuit 56 will output 24 volts. Since each of these power output circuits are the same construction, only one circuit will now be described in detail. In a manner that is well-known in the art, each of the power output circuits includes a full wave rectifier circuit 58 comprising the rectifying diodes 60 and 62 and includes a current sensing transformer 64 coupled to the output of the diodes 60 and 62 by means of conductors 66 and 68 to generate the magnetic flux in the transformer 64. The conductors 66 and 68 are connected to a terminal 70 at which will appear a voltage level $B_1$. As seen in FIG. 1B, connected to the terminal 70 is a power filter circuit comprising a choke and a capacitor 76. The choke 74 is connected to an output terminal 78 at which appears the voltage level $A_1$ of the output circuit. The capacitor 76 is shunted across the terminal 78 and a terminal 80 connected to a ground conductor 82. The conductor 82 is connected to the center tap 84 of the transformer 44.

The current sensing transformer 64 has associated therewith a secondary winding 81 which is connected to ground through the conductor 82. The other end of the transformer 64 is connected over conductor 86 to a signal conditioner 82 comprising a plurality of R.C. circuits which reduce the level of the input signals proportionately appearing on the conductor 86 to a voltage level which may be used by the CMOS circuit elements located in the digital controller 90. Appearing on conductor 86 is a signal $C_1$ representing the level of the current flowing in the transformer 64 and which is transmitted to the signal conditioner 88. As shown in FIG. 1B the voltage level signals $B_1$ appearing at the terminal 70 are transmitted to the signal conditioner 88 over conductor 92, while the voltage level signals $A_1$ appearing at the terminal 78 are transmitted over conductor 94 to the conditioner 88. In a similar manner, the current and voltage level signals of the power circuits 54 and 56 are also connected to the conditioner 88. The resulting voltage signals $V_{R1}$, $b_1$ and $I_1$ (FIG. 1A) generated by the conditioner 88 and representing the input signals $A_1$, $B_1$ and $C_1$ respectively of the circuit 52 are transmitted over conductors 96 to the digital controller 90, enabling the controller to regulate the output of the power supply in accordance with the signals received from the conditioner 88.

As shown in FIG. 1A, the transformer 44 has disposed thereon a secondary winding 98 which is connected by means of conductors 100 and 102 to a second signal conditioner 104 which is similar in construction and operates in the same manner as that of the signal conditioner 88. The secondary windings 98 will generate a pair of balance signals over the conductors 100 and 102 representing the voltage level developed in the transformer 44. As fully described in the previously-cited co-pending application of Bruckner et al., Ser. No. 242,788, which application is fully incorporated herein by reference, the balance signals generated over the conductors 100 and 102 will be used in reducing the effect of the magnetizing current flow of the transformer 44 due to the unequal volts second drive from the operation of the switching transistors 36.

Also connected to the signal conditioner 104 is a conductor 106 connected to the terminal 26 from which a power loss signal (PLS) is generated representing the condition of the bulk voltage level developed at the output of the rectifier 24. This signal is used in detecting a power failure by the digital controller 90. The signal conditioner 104 will output the balance signals $V_{B1}$ and $V_{B2}$ over conductors 108 and 110 and the signal PLS over conductor 112 to the digital controller 90. The controller 90 in response to the signal PLS appearing on the conductor 112, will then enter into a power-up sequence characterized as a "soft start sequence", enabling the operation of the power supply to start. When the signal PLS goes high, indicating that the voltage has reached 78% of its normal value, the controller 90 is reset and the power signal $V_{DD}$ appearing on conductor 115 is connected to the remainder of the controller 90 enabling the controller for operation.

After being reset, the controller 90 will initiate a delay of 60 ms. or 3 power line cycles. When the delay is complete, the switching control signals Q1 and Q2 appearing on the conductors 38 and 40 and which are generated in the digital controller 90 will begin switching at a minimum duty cycle period which duty cycle period will be incrementally increased after a predetermined time period has elapsed. This switching action will continue until an overcurrent condition is detected. Upon the detection of an overcurrent condition, the signals ∅1 and ∅2 will start switching at a second predetermined or constant minimum duty cycle until the overcurrent condition is removed at which time the signals ∅1 and ∅2 will resume switching at the duty cycle existing prior to the detection of the overcurrent condition. This soft start operation continues until the voltage level $A_1$ appearing at the terminal 78 in the power output circuit 52 reaches 90% of its normal value or until 100 ms. from the beginning of the switching operation has elapsed, whichever occurs first. If the predetermined voltage level $A_1$ occurring at terminal 78 is reached first, the controller continues its soft start operation for another 20 ms. (or 1 power line cycle) and then commences a regulation mode of operation.

When the controller is operated in the regulation mode, the duty cycle of the switching signals ∅1 and ∅2 are continuously adjusted based on the voltage levels $A_1$ and $B_1$ appearing at the terminals 70 and 78 respectively in the power output circuit 52 to maintain a plus or minus 1 percent static regulation and plus or minus 2 percent dynamic regulation of the power output circuit 52 (FIG. 1B). During the time the controller is operating in the regulation mode, the controller continuously monitors the feedback data generated by the signal conditioner 88 and will stop the generation of the signals ∅1 and ∅2 upon sensing the occurrence of a system fault. As will be explained more fully hereinafter, the controller at this time will leave a diagnostic data latch and the circuitry associated with the signal PLS operational. The diagnostic data latches will be accessible by a serviceman at a later time. Included in the construction of the controller is the capability of the controller to display the fault isolation condition on a plurality of light-emitting diodes for a period of 20 seconds when enabled.

Figure 12A:
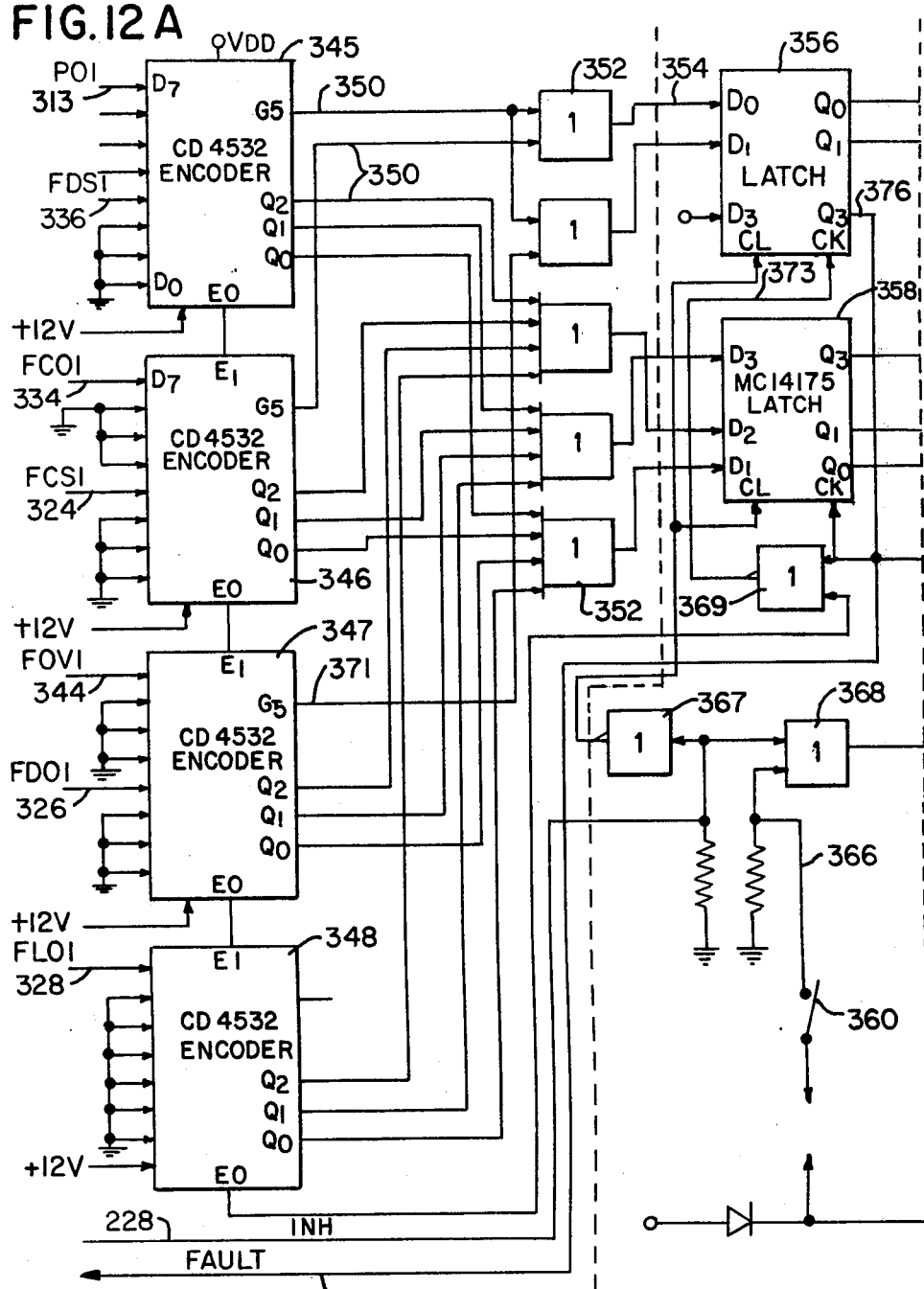
FIGS. 12A and 12B taken together disclose the logic circuits which are incorporated in the display for identifying the faulty element.
Figure 12B:
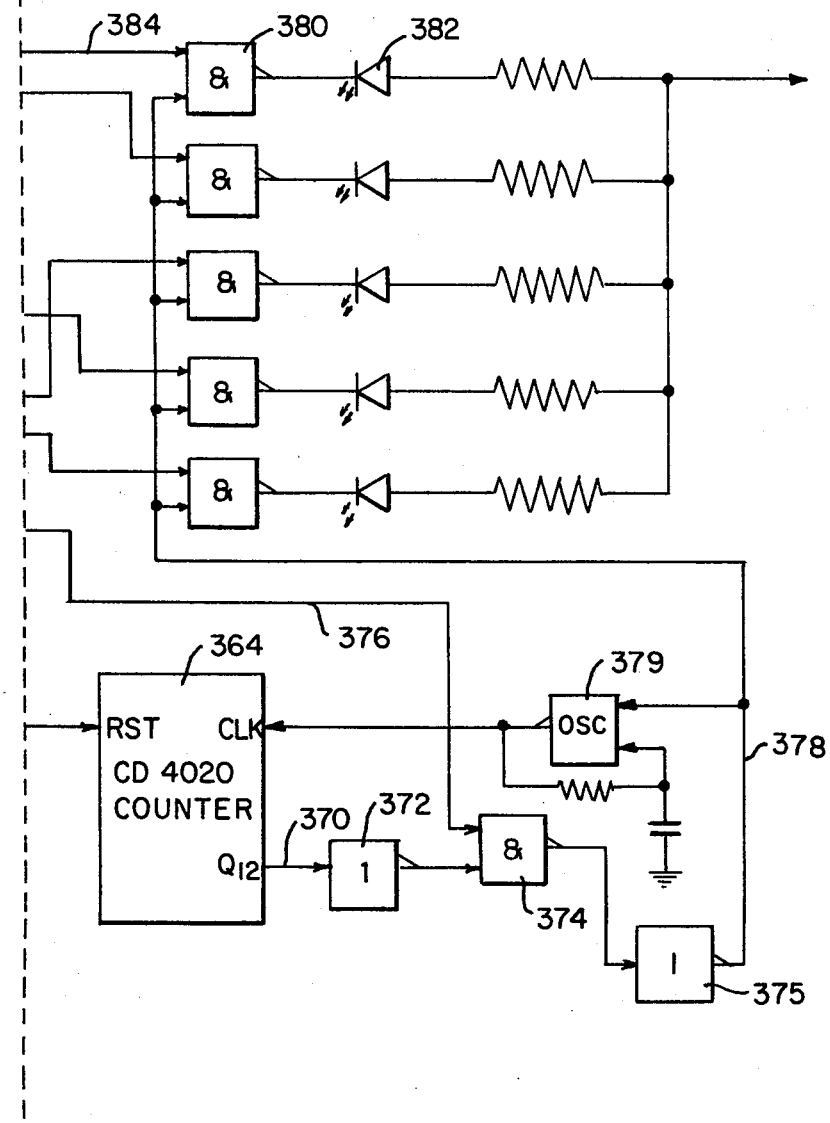
Figure 13:
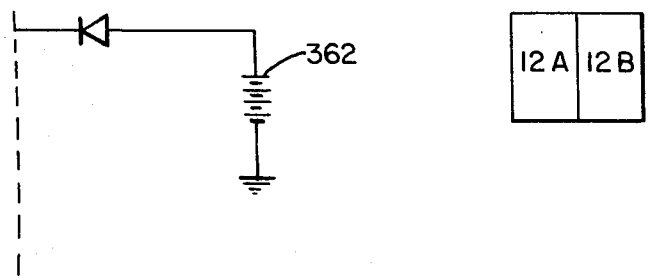

The controller 90 will output a low signal PFS (power fail sense) over conductor 114, (FIG. 1), indicating the occurrence of a power loss and the signal DSPO over conductor 119 which is transmitted to a plurality of LED drivers (FIG. 12B) for fault identification after a power system shutdown. The controller will also receive a manually selected signal DCL over conductor 116 selecting either a single ended or double ended rectification mode of operation of the power system. When selected for a single ended operation, the maximum duty cycle of the switching signals ∅1 and ∅2 shall be reduced to 66 percent of their value in the double ended operation. A signal DFPS appearing on conductor 118 selects either a 20 KHz. or 40 KHz. switching frequency, while a signal DSPR appearing on conductor 120 is a reset signal to the serial readout diagnostic output latches (FIGS. 12A and 12B). For a complete disclosure of the circuitry for regulating the duty cycle of the switching signals ∅1 and ∅2, reference should be made to the previously-cited co-pending application Ser. No. 242,788 of Bruckner et al.

Figure 2:
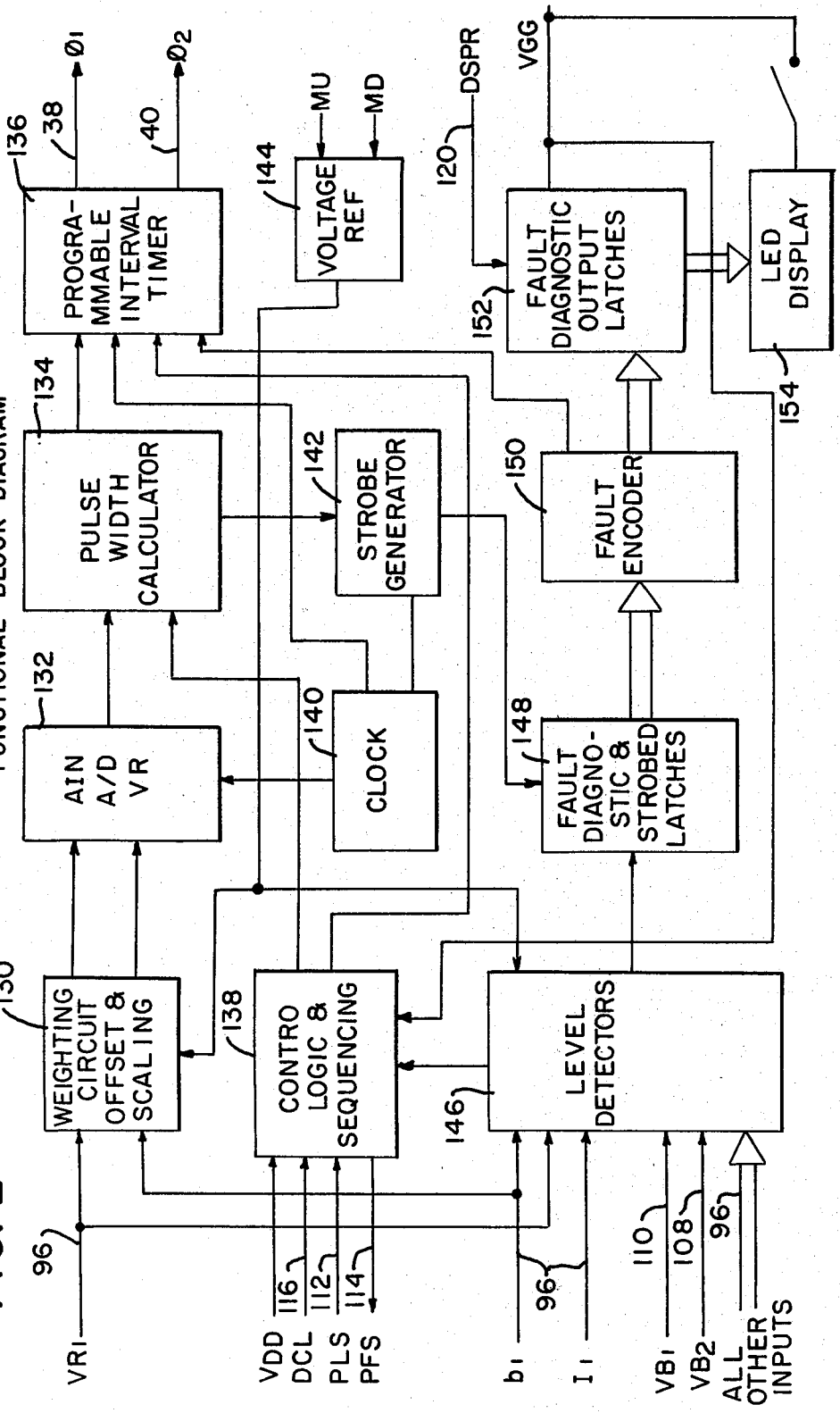
FIG. 2 is a block diagram of the digital controller of the present invention showing those portions which provide the diagnostic capability of the controller.

Referring now to FIG. 2, there is shown a block diagram of the digital controller 90. As previously disclosed, the controller 90 will regulate the power supply output by altering the duty cycle of the ∅1 and ∅2 switching signals for the power transistor switches 36 (FIG. 1A) in accordance with the power requirements of the system. This information is contained in the power level signals $A_1$ and $B_1$ appearing at the terminals 76 and 78 of each of the power level circuits 52-56 inclusive (FIG. 1B). By monitoring the power supply output voltage present at these terminals, the controller can adjust the ∅1 and ∅2 duty cycles up or down to counteract the change in the output voltage of the power output circuits 52-56 inclusive (FIG. 1). As fully disclosed in the co-pending application of Bruckner et al., the controller 90 will control the duty cycle of the switching transistors 36 by adjusting the pulsewidth of the switching control signals ∅1 and ∅2 in accordance with the signals generated by the signal conditioner 88 (FIG. 1A).

As shown in FIG. 2, the digital power controller 90 includes a weighting circuit 130 enabling the value of the power output level signals $V_{R1}$ appearing on line 96 (FIG. 1A) to be offset and scaled to make use of all the codes available at the output of an A/D converter 132 for the output voltage range of the power output circuit 52, namely, 4.125 V to 5.5 V. The output of the circuit 130 is transmitted to a CMOS analog/digital (A/D) converter 132 which converts the analog voltage signals into proportional digital signals. The signals are then transmitted to a pulse-width calculator circuit 134 for calculating the pulsewidth of the switching signals ∅1 and ∅2 which are then outputted over conductors 38 and 40 from a programmable interval timer 136 to the switching transistors 36 (FIG. 1A). Associated with these circuits is a control logic and sequencing circuit 138 for logically operating the circuits 134 and 136. Also included in the controller 90 is a clock circuit 140 for generating the various clock signals used in the operation of the controller, together with a strobe generator circuit 142 for use in sensing the occurrence of a fault condition within the controller. Further included in the controller 90 is a reference voltage source 144 whose level may be adjusted by the signals MU and MD and which is used in the weighting circuit 130 together with level detectors 146 for sensing the various power levels occurring at various elements of the controller. A fault diagnostic and strobe latch 148, together with a fault encoder 150, fault diagnostic output latches 152, and an LED display 154 constitute the diagnostic circuits associated with the controller. For a complete disclosure of the circuits 130-138 inclusive, reference should be made to previously cited co-pending application of Bruckner et al.

Referring now to FIGS. 3A and 3B inclusive, there is shown the timing circuit for generating the various control signals used in the operation of the power supply. As shown in FIG. 3A, a 5 MHz. clock signal generated from a 5 MHz. oscillator (not shown) is transported over conductor 160 into the clock input of a SCL4029 4-bit counter 162 which divides the input clock signal by 16 to output over conductor 164 the 320 KHz. clock signal (FIG. 5A). The conductor 164 is coupled to the clock input of a second MC14163 4-bit counter 166 which will output over its output conductor 168 the 20 KHz. clock signal (FIG. 5E) to a gate circuit which includes NOR gates 170-174 inclusive, the NAND gates 176 and 180, the AND gate 178, together with the NOR gates 182-186 inclusive (FIG. 3B) and the NAND gates 188 and 190 which circuit outputs over conductors 191 the 4-bit clock signals into a CD40257 selector 192 (FIG. 3B). The selector 192 is operated by a signal FREQSEL which appears on conductor 194 and which is manually generated by the operator to select either a 20 KHz. or 40 KHz. switching frequency. The signal FREQSEL will be high if a 40 KHz. frequency is selected or low if a 20 KHz. frequency is selected. The signal FREQSEL will operate the selector 192 to output over conductors 196 the selected binary bits to a plurality of level shift gates 198 which shift the level of the output signal to a voltage level enabling the TTL circuits to operate. Appearing on the output line 200 is the control signal ST (FIG. 5I) which is used in the generation of the switching control signal ∅1. Appearing on the output line 202 is the clocking signal TS (FIG. 5G) which is used in the generation of the second switching control signal ∅2. Appearing on the output line 204 is the signal FLIPCLOCK, while appearing on the output conductor 206 is the load signal LD (FIG. 5H) which signals are used in the generation of the pulse width of the switching control signals ∅1 and ∅2.

The 20 KHz. signal (FIG. 5E) appearing on one of the output conductors 168 of the counter 166 (FIG. 3A) will clock a CD 4020 timer 212 which will output clocking signals over its output conductors 214 to a pair of AND gates 216 and 218 whose output signals are transmitted over conductors 220 and 222 to a pair of CD4013 D-type flip-flops 224 and 226. Appearing on the $\overline{Q}$ output conductor 228 of the flip-flop 224 will be the inhibit signal INH which, as shown in FIG. 5K, will go high at the time the controller is reset by the reset signal RST (FIG. 5J) and will go low 60 ms. after the signal RST goes low. This 60 ms. delay allows the controller 90 to condition the switching of the transistors 36 to occur after the controller has been reset. Appearing on the Q and $\overline{Q}$ outputs of the flip-flop 226 will be the power up signals PWRUP appearing on line 230 and the inverted power up signal $\overline{PWRUP}$ (FIG. 5L) appearing on line 232. After 100 ms. has elapsed, the output count of the timer 212 which appears on the input of the AND gate 218 enables the gate to output a clocking pulse to the flip-flop 226 resulting in the signal $\overline{PWRUP}$ going high. If the power supply does not attain 90% of its rated value within 100 ms. of the time it started its switching operation, the controller will shut down the power up operation.

Also included in the timing circuit of FIGS. 3A and 3B is a reset circuit which includes a NAND gate 234 powered by a 12 volt power supply 236 tied to ground through a 4.7K resistor 238 and a 4.7 μF capacitor 240. Further included in the reset circuit is the NAND gate 241 which receives the output signal from gate 234 and the output signal from a second NAND gate 242. The NAND gate 242 receives the power loss signal PLS appearing on conductor 112 (FIG. 1A) and the Q output of the flip-flop 224 over conductor 243. The signal PLS (FIG. 12B) will go high when the bulk voltage appearing at the filter capacitor 30 (FIG. 1A) reaches 78% of a reference voltage thereby enabling the NAND gates 241 and 242 to output over conductor 244 the reset signal RST (FIG. 5J) to reset various circuits in the controller 90. Upon the signal PLS going high, power is supplied to the controller 90 which charges the capacitor 240 resulting in the generation of the signal RST. Also included in the timing circuit is a CD4029 timer 245 clocked by a clock signal appearing on the output line 214 from the timer 212 and which is transmitted through the NAND gates 246 and 248. The timer 245 will output the control signal REG (FIG. 5N) whic occurs 20 ms. after the control signal PM (FIG. 5M) appearing on the input line 250 to the NAND gate 246 goes high at the time the power supply has attained 90% of its normal value within 100 ms. of its switching operation. The signal REG appearing on the output line 252 (FIGS. 3A and 3B) of the timer 244 is transmitted to one input of a NAND gate 254 (FIG. 3B) which outputs the signal REG over line 256 for use in enabling the controller to initiate a power-up sequence.

Figure 6A:
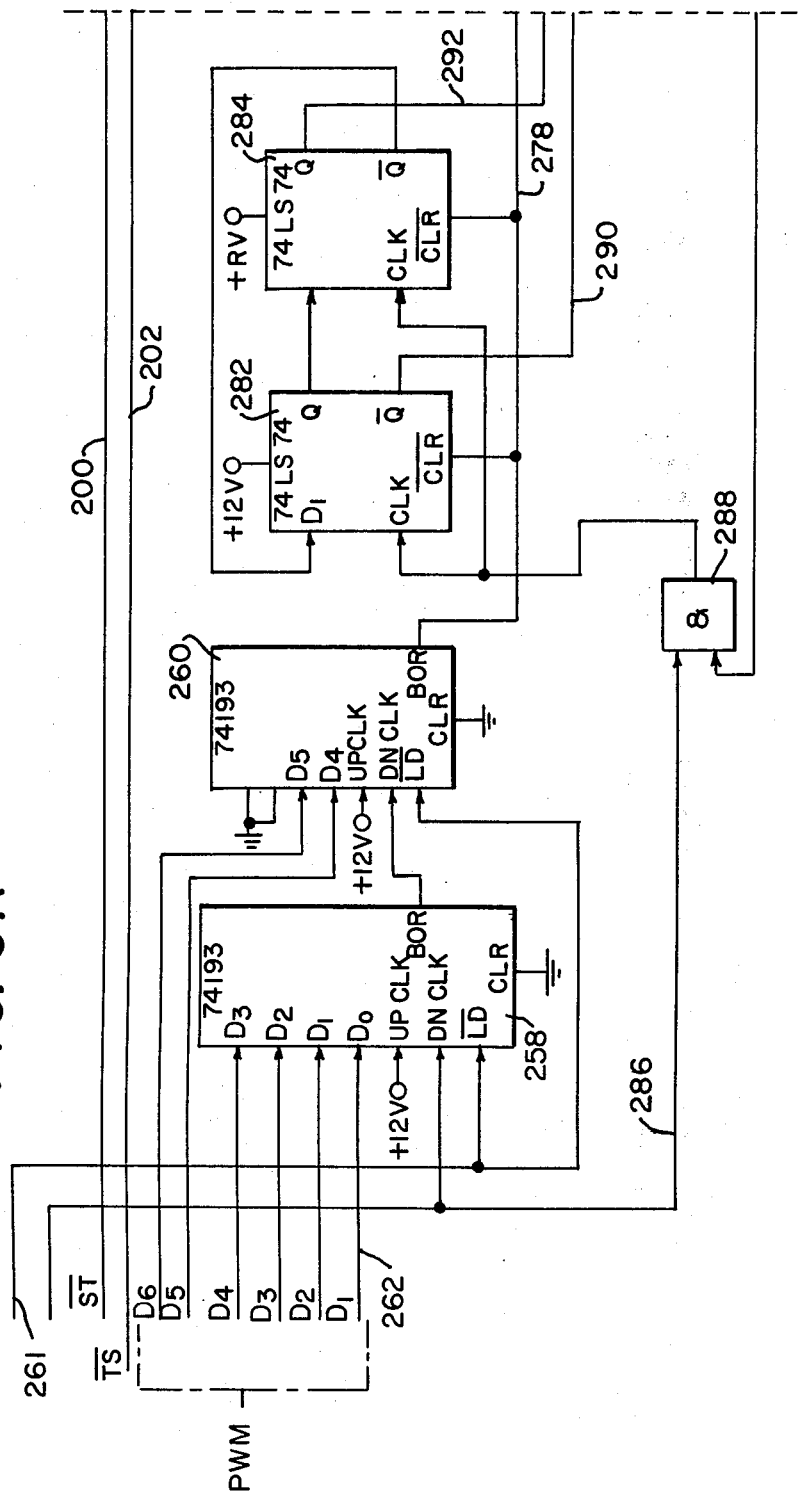

Referring now to FIGS. 6A and 6B, there is disclosed the logic circuits for generating a plurality of strobe signals used by the controller when in a diagnostic mode. Included in the strobe generating circuit are a pair of 74193 counters 258 and 260 (FIG. 6A). The counters 258 and 260 are preset by a plurality of binary bits $D_1$–$D_6$ inclusive appearing on conductors 262 representing the pulse width of the clocking signals $\emptyset 1$ and $\emptyset 2$. As disclosed in the previously cited Bruckner et al. co-pending application, the binary bits are shifted one position to the right when loaded into the counters 258 and 260 to divide the pulse width value by two. The counters 258 and 260 are operated by the load signal $\overline{LD}$ (FIG. 5H) appearing on conductor 261 to output a high signal over conductor 278 after down-counting the input binary bits to zero. The signal is inputted into an AND gate 274 (FIG. 6B) which is enabled to output over conductor 276 a strobe pulse STB which occurs in the middle of the $\emptyset 1$ and $\emptyset 2$ clocking pulses. As fully disclosed in the previously-cited co-pending application of Bruckner et al., a pair of 74LS74 flip-flops 264 and 266 (FIG. 6B) are enabled to output over their output lines 38 and 40 respectively the switching control signals $\emptyset 1$ and $\emptyset 2$. The duration of the switching clock pulses is controlled upon the resetting of the flip-flops 264 and 266 by a clear signal appearing on the input lines 268. The switching control signals $\emptyset 1$ and $\emptyset 2$ are also transmitted to one input of a pair of AND gates 270 and 272, whose other inputs receive the high strobe signal generated by an AND gate 274 over line 276. The operation of the AND gate 274 is controlled by a high signal received from a NAND gate 294. A pair of 74LS74 flip-flops 282 and 284 (FIG. 6A) which are clocked by a 5 MHz. clock signal appearing on line 286 and outputted by an AND gate 288 enables the flip-flops 282 and 284 to output low and high clock signals over the output lines 290 and 292, respectively, to the NAND gate 294 (FIG. 6B) whose output high signal enables the AND gate 274 to output the high strobe signal STB appearing on line 276. This signal appearing on line 276 is transmitted to the other input of the AND gates 270 and 272 which outputs the strobe signals STB1 and STB2 signals over the output lines 296 and 298 respectively, which signals are used in the diagnostic circuitry of the controller.

Figure 8A:
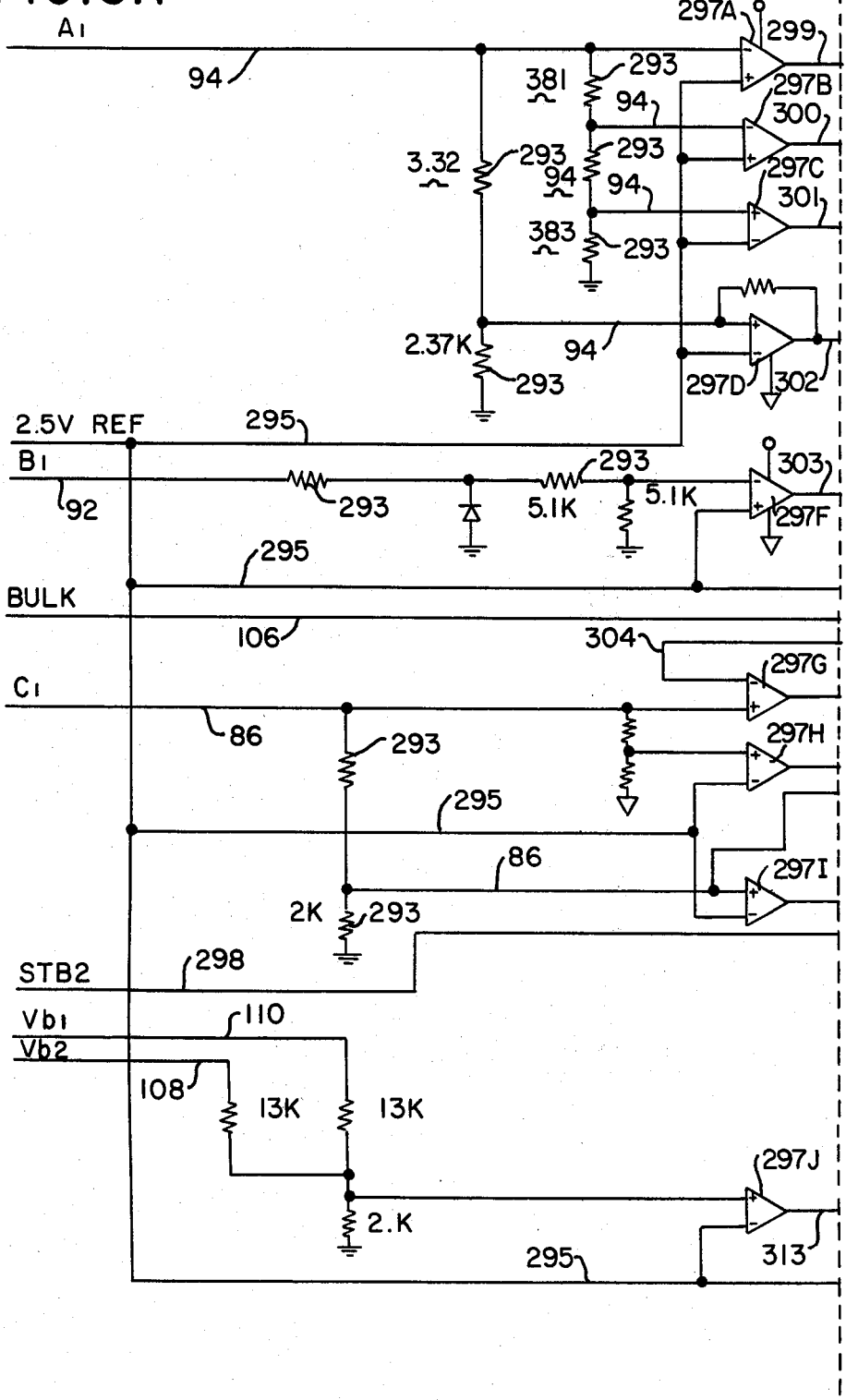

Referring now to FIGS. 8A and 8B, there is shown the circuits for generating control signals representing the operating condition of the power supply with respect to the voltage and current levels within the power supply. Included in the circuit are a plurality of MC3302 operational amplifiers 297A–297J inclusive (FIGS. 8A and 8B) which will compare the voltage level signals $A_N$, $B_N$, $C_N$ of each of the circuits 52–56 inclusive (FIG. 1B) and the bulk voltage signals BULK appearing on the output of the bridge rectifier 24 (FIG. 1A) with a reference voltage to generate the signal PLS representing a power loss condition if the sensed voltage level is less than the reference voltage level. As shown in FIG. 8A, the voltage level $A_1$ appearing on conductor 94 (FIG. 1B) is inputted through a plurality of voltage drop resistors 293 to the input of a plurality of the voltage comparators 297A–297D inclusive which compares various levels of the inputted voltage signals appearing on conductor 94 with a 2.5 V reference voltage signal appearing on conductor 295 resulting in the comparators 297A–297D outputting the signals VR1VL over conductor 299 (FIG. 8B) if the voltage level is very low compared with the reference voltage; the signal VR1L over conductor 300 if the voltage level is low, the signal VR1H over conductor 301 if the voltage level is high and the signal VR1VH over conductor 302 if the voltage level is very high. In a similar manner, the voltage signal $B_1$ appearing on conductor 92 will be compared by the comparator 297E to generate the signal B1L over conductor 303 if the voltage level is low. The bulk voltage level appearing on conductor 106 is compared with the 2.5 V reference signal appearing on conductor 295 by the comparator 297F (FIG. 8B) which will raise the signal PLS if the bulk voltage level is 78% of the reference voltage.

The signal $C_1$ appearing on conductor 86 is compared by the comparator 297G with a 0.5 V reference voltage appearing on conductor 304 and outputted by the amplifier 315 (FIG. 8B) to raise the signal IVL over conductor 305 (FIG. 8B) if the voltage level is very low. The signal $C_1$ is also compared by the comparator 297H with the 2.5 V reference signal to raise the signal IVH over conductor 306 if the voltage level of $C_1$ is very high. The signal $C_1$ is further transmitted to the comparator 297I whose output signal is transmitted to the D input of the flip-flop 307 which when clocked by the strobe signal STB2 appearing on conductor 298 will output the overcurrent signal 5VOIP over conductor 308. The balance signals $V_{b1}$ and $V_{b2}$ appearing on conductors 108 and 110 (FIGS. 1A and 8A) are inputted into the noninverting input of voltage comparator 297J (FIG. 8A) which receives the 2.5 reference voltage over conductor 295 to output the control signal POI over conductor 313 indicating an overcurrent condition in the primary windings of the transformer 44 (FIG. 1A). A more detailed description of the signals generated by the comparators 297A–297I is disclosed in the following Table I which defines the signals with respect to their nominal value.

TABLE 1

| Input, Sense Point or Term | Term or Logic Term Definition |
|---|---|
| VRn<br>n = 1, 2, 3 | VRnVL = Voltage lever on VRn input less than 50% of its normal value.<br>VRnL = Voltage level on VR1 input less than 90% and on VR2 & VR3 in- |

TABLE 1-continued

| Input, Sense Point or Term | Term or Logic Term Definition | |
|---|---|---|
| | | puts less than 85% of their normal value. |
| | VRnH = | Voltage level on VR1 input greater than 112% and on VR2 and VR3 inputs greater than 115% of their normal value. |
| | VRnVH = | Voltage level on VR1 input greater than 125% and on VR2 and VR3 inputs greater than 130% of their normal value. |
| bn n = 1, 2, 3 | bnL = | Voltage level on bn input less than 50% of its normal value. |
| In n = 1, 2, 3 | InVH = | Voltage level on In input greater than 140% of its normal peak value. |
| | InVL = | Voltage level on In input less than 10% of its normal peak value. |
| Output Fault Monitor STB, STB1, STB2 (Strobe) | STB = | This strobe occurs during the middle of the On time of ∅1 and ∅2. |
| STB1 | STB1 = | Strobe during the middle of the On time of ∅1. |
| STB2 | STB2 = | Strobe during the middle of the On time of ∅2. |

Figure 10A:
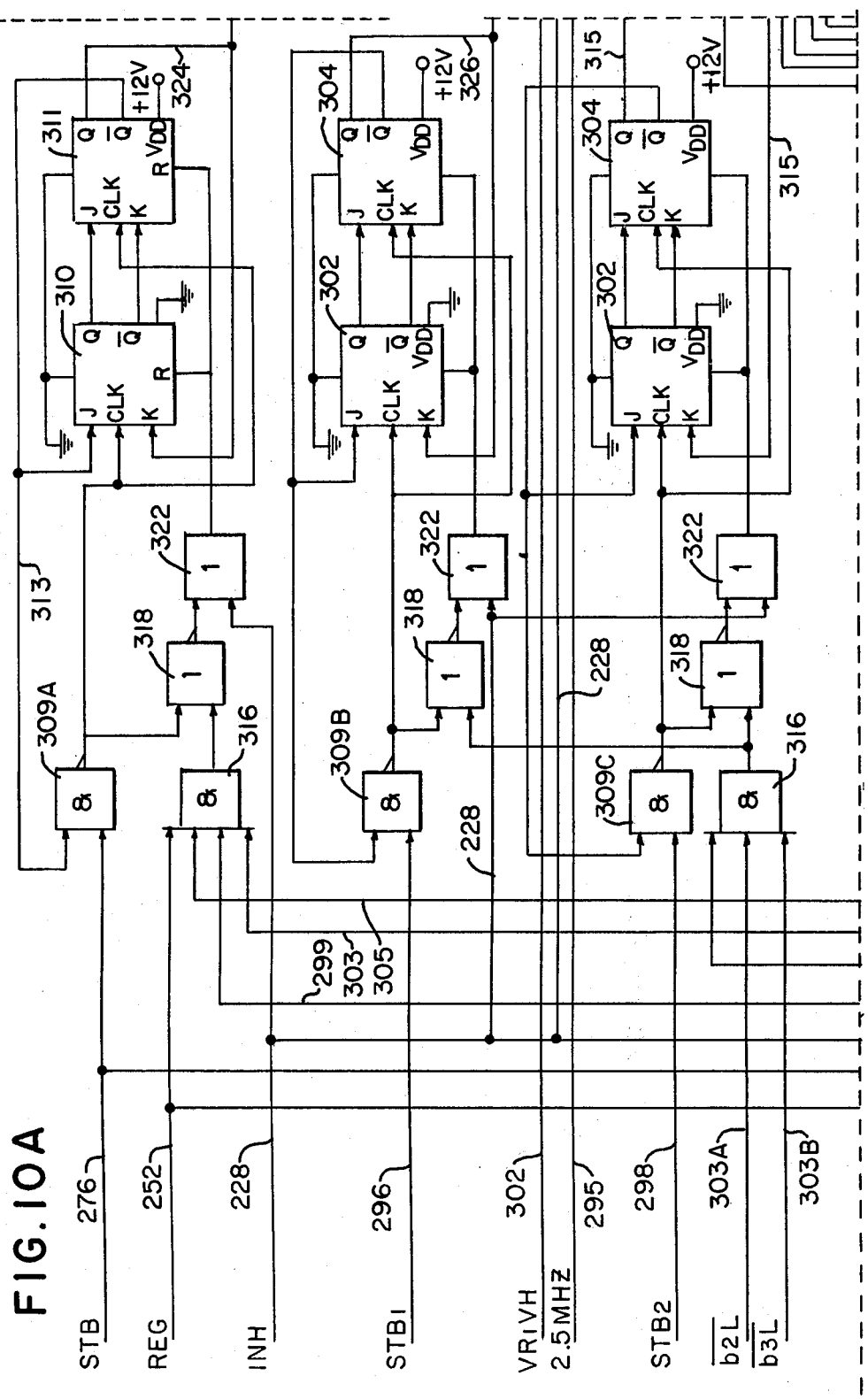
Figure 10C:
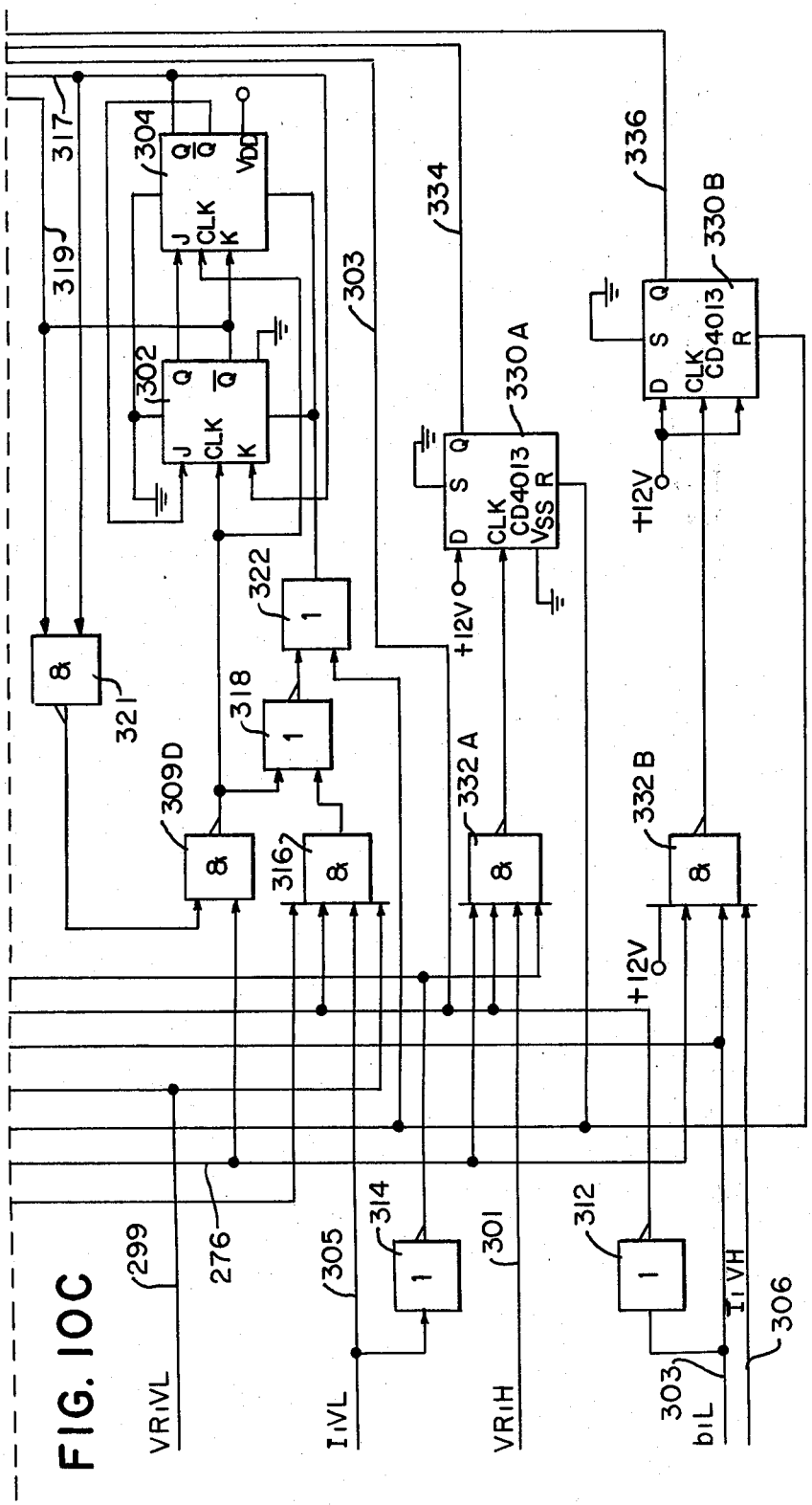

Referring now to FIGS. 10A–10C inclusive, there is shown the logic circuits for generating signals representing the occurrence of a fault in the power supply system. As shown in FIGS. 10A and 10B, the strobe pulse STB appearing on the input line 276 (FIG. 6B) is transmitted to one input of a NAND gate 309A enabling the NAND gate to clock a pair of CD4027 flip-flops 310 and 311 associated with a shorted output capacitor of the power supply. As shown in the following Table II a failure of the component listed associated with the circuit 52 (FIG. 1B) will produce the corresponding voltage signals shown in FIG. 10C. The same signals will be produced for similar components in the circuits 54 and 56 (FIG. 1B).

TABLE II

POWER CIRCUIT 52

| COMPONENT OR SUB-ASSEMBLY | FAULT | FAULT SENSE POINTS REQUIRED | CONDITION FOR FAULT RECOGNITION |
|---|---|---|---|
| | Switches | b1, b2, b3 | $\overline{T}$=(b1L·b2L·b3L·STB) FC2 |
| Overvoltage Fault | OVF1 | BR1 | VR1VH (2 us) |
| | Primary Overload OIP | | IPR1VH |
| Diodes D1, D2 | Open | b1, b2, b3 | fo=(b1L·$\overline{b2L}$·b3L·STB) FC2 |
| | Short | I1, b1 | fs=(I1VH·b1L·STB) FC1 |
| L1 | Open | I1, b1, I2 | fo=($\overline{I1VL·b1L·I2}$) |
| C01 | Open | I1, b1, VR1 | fo=($\overline{I1VL·b1L·VR1H·STB}$) FC1 |
| | Short | I1, b1, VR1 | fs=($\overline{I1VL·b1L·VR1VL·STB}$) FC2 |

The disabling of the power supply by a shorted output capacitor results in the raising of a control signal I1VL appearing on conductor 305 and the raising of the signal VR1VL appearing on conductor 299 and the raising of the signal bNL appearing on conductor 303. Signal I1VL appearing on the input line 305 is inverted by an inverter 314 (FIG. 10C) while the signal b1L appearing on conductor 303 is inverted by inverter 312. The condition for the fault recognition and the exploration of the terms are given in Tables I and II. The terms without the bar indicate an active high while those with the bar are active low. Each of these high signals are transmitted to an AND gate 316 (FIG. 10A) whose high output signal indicating a fault condition is coupled to a NOR gate 318 which receives the clock signal from the NAND gate 309A. At this time the inhibit signal INH appearing on conductor 228 is low because of the controller being in a regulation mode enabling the low output signal of the NOR gate 318. This low signal is transmitted through an OR gate 322 to the reset input of a counting circuit comprising the flip-flops 310 and 311 resetting the flip-flops. The counting circuit will start counting with the output signal appearing on conductor 313 being clocked through the NAND gate 309A by the strobe signal STB appearing on conductor 276. Upon the output count reaching two, a low signal will appear on conductor 313 which is inputted into the NAND gate 309A disabling the signal STB which stops the counter. At this time, the Q output signal FCS1 of the flip-flop 311 appearing on conductor 324 (FIG. 10B) will be high indicating a shorted output capacitor as the fault in the circuit. In a similar manner, the signal FDO1 appearing on the output conductor 326 represents the fault as an open diode, while the high signal FLO1 appearing on the output conductor 328 (FIG. 10B) which is the output of the AND gate 329 will indicate the occurrence of an open choke. With respect to the open diode circuit, the counting circuits are clocked separately by the strobe signals STB1 appearing on conductor 296 and the strobe signal STB2 appearing on conductor 298. The Q output signals of the flip-flops 304 (FIG. 10A) appearing on conductors 326 and 315 are inputted into the OR gate 325 (FIG. 10B) which outputs the signal FDO1 on conductor 326. With respect to the open choke circuit, the fault condition has to be valid for three successive counts. Once the counting circuit comprising the flip-flops 302 and 304 (FIG. 10C) reaches the count of three, the $\overline{Q}$ signal of the flip-flop 302 and the Q signal of flip-flop 304 go high. These signals are transmitted over conductors 319 and 317 respectively to the AND gate 329 (FIG. 10B) which outputs the high signal FLO1 on conductor 328 indicating an open choke. The signals appearing on conductors 317 and 319 are also inputted into a NAND gate 321 (FIG. 10C) which outputs a high signal to the NAND gate 309D. The gate 309D will output a low signal thereby disabling the counting circuit.

As shown in FIG. 10C, a CD4013 flip-flop 330A will be clocked by a clock signal appearing on the output of a NAND gate 332A which receives the input signals $\overline{\text{I1VL}}$ and b1L previously described with respect to the AND gate 316 (FIG. 10A) in addition to the strobe signal STB received over conductor 276 and the signal VR1H received over conductor 301. The output of the NAND gate 332A will go from high to low when a fault condition occurs. Upon the clocking of the flip-flop 330, a high signal will appear on the Q output line 334 indicating the disabling of the component associated with this circuit. The signal FCO1 associated with the output line 334 of the flip-flop 330A is an open output capacitor, while the element associated with the signal FDS1 on the output line 336 of the flip-flop 332B is a shorted diode. Referring again to FIG. 10B, there is shown a presettable counter 338 which is enabled by the output signal of the AND gate 339 which in turn is enabled by the signal VR1VH appearing on conductor 302 (FIG. 10A) and inverted by the inverter 341. The signal VR1VH must remain valid for at least 2 us. to avoid nuisance tripping. The counter 338 is clocked by the 2.5 MHz. clock signals appearing on conductor 295 (FIG. 10A) and gated by the AND gate 340 (FIG. 10B). If the signal VR1VH goes low before 2 us. has elapsed, the counter 338 is reset to zero. After the counter 338 has outputted a predetermined count, a low signal $\overline{\text{FOV1}}$ appears on the $Q_4$ output conductor 342 of the counter 338, which signal is inverted by the inverter 343 and outputted over conductor 344 indicating an overvoltage condition in the power supply. The output signal appearing on conductor 342 is also inputted in the AND gate 339 and 340 which stops the counter 338. Upon the raising of a signal indicating the disabling of its associated component, the signals appearing on any of the output lines 324–328 inclusive, 334 and 336 (FIG. 10B) will be transmitted to a plurality of priority encoders (FIG. 11A) to determine the priority between the simultaneous occurrence of two or more faults.

Referring now to FIGS. 12A and 12B, there is shown the fault display circuitry including priority encoders 345–348 inclusive which determine priority of the faults generated by the signals appearing on the output conductors 313, 324–328 inclusive, 334 and 336 (FIGS. 8B and 10B). As shown in FIG. 12A, the circuit includes a plurality of CD4532 priority encoders 345–348 inclusive which receive on their input lines the signals cited above, identifying the component in the power supply which has become disabled and inputted into the encoders 345–348 according to the level of importance. Thus the signal PO1 (FIG. 8B) appearing on conductor 313 and representing an overcurrent condition in the primary windings of the transformer 44 (FIG. 1A) is given the highest priority when two faults occur simultaneously while the signal FLO1 has the lowest priority. In addition to determining priority, the priority encoders 345–348 will output over their output conductors 350 a five bit binary number identifying the faulty component to the inputs of an OR gate 352 whose output conductors 354 are coupled to a pair of MC141758 latches 356 and 358 (FIG. 12A) for storing the binary bits appearing on its input conductors representing the component which has failed. Upon the storing of the binary number in the latches 356, 358, a high signal FAULT will appear on the $Q_3$ output conductor 376 of latch 356. The signal is inputted into a NAND gate 374 which also receives the low signal appearing at the $Q_{12}$ output of the counter 364 and which is inverted by the inverter 372. The low output signal of NAND gate 374 is inverted by the inverter 375 whose high output signal on conductor 378 is transmitted to the LED drivers 380 enabling the drivers to display the binary number stored in the latches 356 and 358. The high signal on conductor 378 also enables a CD4093 Schmitt trigger low frequency oscillator 379 whose output signals will clock a CD4020 binary counter 364. After 20 seconds has elapsed, the counter 364 will output a high signal on its $Q_{12}$ output conductor 370 which signal is inverted by the inverter 372 to disable the NAND gate 374, the oscillator 379 and the LED display 382.

As shown in FIG. 12A, a switch 360, when momentarily actuated by a serviceman after the power supply has been shut down, will supply power from a battery 362 (FIG. 10B) to the CD4020 counter 364 (FIG. 12B) over conductor 366 through an OR gate 368 resetting the counter to output a low signal for a period of 20 seconds over its output conductor 370 through an inverter 372 to one input of a NAND gate 374. The NAND gate 374 enabled by the high signal appearing on the output of the inverter 372 will output a low signal which is inverted by the inverter 375 to repeat the energizing of the display for a period of 20 seconds in the manner described previously. The signal Fault appearing on conductor 376 (FIG. 12A) notifies the controller 90 (FIG. 1A) to shut down the power supply. The binary number that is displayed and the circuit element in the power circuits 52–56 inclusive (FIG. 1B) that it represents are disclosed in the following Table III.

TABLE III

DIAGNOSTIC FAULTS & FAULT CODES

| FAULT | PRIORITY # STARTING WITH HIGHEST | FAULT CODE ||||| 
|---|---|---|---|---|---|---|
| | | LD4 | LD3 | LD2 | LD1 | LD0 |
| Primary Overload | 30 | 1 | 1 | 1 | 1 | 0 |
| D1, D2 Short | 28 | 1 | 1 | 1 | 0 | 0 |
| D3, D4 Short | 27 | 1 | 1 | 0 | 1 | 1 |
| D5, D6 Short | 26 | 1 | 1 | 0 | 1 | 0 |
| C01 Open | 22 | 1 | 0 | 1 | 1 | 0 |
| C02 Open | 21 | 1 | 0 | 1 | 0 | 1 |
| C03 Open | 20 | 1 | 0 | 1 | 0 | 0 |
| C01 Short | 19 | 1 | 0 | 0 | 1 | 1 |
| C02 Short | 18 | 1 | 0 | 0 | 1 | 0 |
| C03 Short | 17 | 1 | 0 | 0 | 0 | 1 |
| OVF1 | 16 | 1 | 0 | 0 | 0 | 0 |
| OVF2 | 15 | 0 | 1 | 1 | 1 | 1 |
| OVF3 | 14 | 0 | 1 | 1 | 1 | 0 |
| D1, D2 Open | 13 | 0 | 1 | 1 | 0 | 1 |
| D3, D4 Open | 12 | 0 | 1 | 1 | 0 | 0 |
| D5, D6 Open | 11 | 0 | 1 | 0 | 1 | 1 |
| Controller Fault | 10 | 0 | 1 | 0 | 1 | 0 |
| PFS Fault | 9 | 0 | 1 | 0 | 0 | 1 |
| L1 Open | 4 | 0 | 0 | 1 | 0 | 0 |
| L2 Open | 3 | 0 | 0 | 0 | 1 | 1 |
| L3 Open | 2 | 0 | 0 | 0 | 1 | 0 |
| No Fault or Normal Power Down | 0 | 0 | 0 | 0 | 0 | 0 |

The serviceman using this information will then be able to determine which element is to be replaced.

Figure 14:
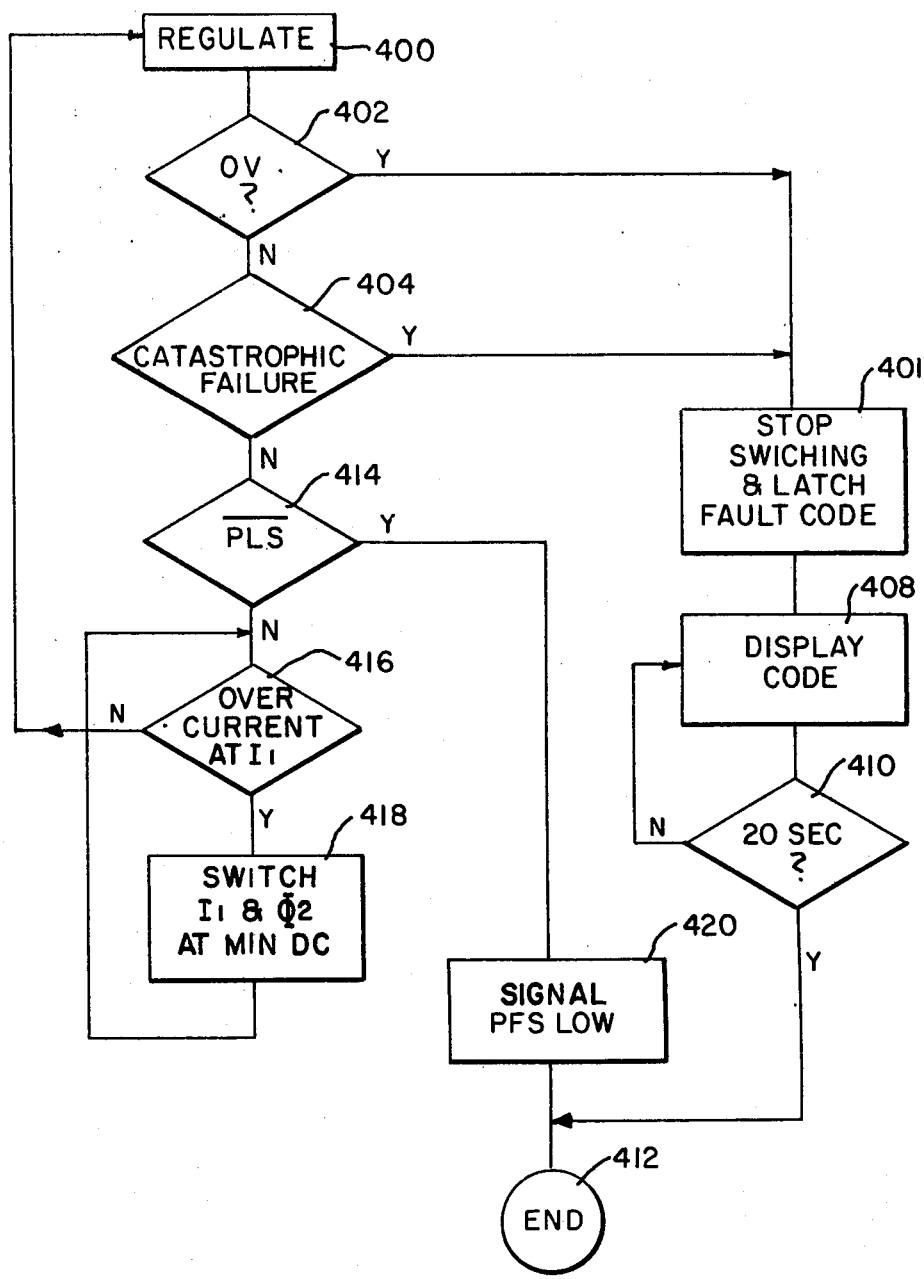
FIG. 14 is a flowchart of the operation of the controller when in a diagnostic mode.

Referring to FIG. 14, there is shown a flowchart of the operation of the controller when in a diagnostic mode. During the regulation of the power supply (block 400), the controller checks the output signals from the signal conditioner 88 (FIG. 1A) to see if an overvoltage condition exists (block 402). If such a condition exists, the controller will stop switching the ⌀1 and ⌀2 signals and latch the fault code (Table III) in the latches 356 and 358 (FIG. 12A). If the controller does not find an overvoltage condition, the controller will check for a catastrophic failure of a component (block 404). If it finds that this condition exists, the controller will stop switching the signals ⌀1 and ⌀2 and latch the fault code (block 406), display the location of the fault in a LED display 382 (block 408) for a period of 20 seconds (block 410). After this time, the display will be turned off and the operation ended (block 412).

If the controller fails to sense any of the above conditions, the controller will check the PLS signal received over line 112 (FIG. 1A) to determine if the power output level is less than 78% of the rated output (block 414). If such a condition exists, the controller will lower the signal PFS (block 420) over line 114 (FIG. 1A) resulting in the shutdown of the system (block 412). If the signal PLS is not low, the controller will check for an overcurrent condition (block 416). If it does not find such a condition exists, the controller will continue in its regulation mode. If the controller finds an overcurrent condition, it will switch the signals ⌀1 and ⌀2 at a minimum duty cycle (block 418) until the overcurrent condition is removed at which time the controller will continue in a regulation mode. Reference should be made to the previously cited co-pending application of Bruckner et al., Ser. No. 242,788 for a disclosure of the operation of the controller in generating the control signals ⌀1 and ⌀2 for use in regulating the power supply.

The IC circuits disclosed in this application are commercially available from the following manufacturers. Those circuits having the prefix MC are available from the Motorola Corporation of Phoenix, Arizona; the prefix CD from RCA Corporation of New York, N.Y.; the prefix MP from Analog Devices of Santa Clara, California and the prefix LM from National Semiconductor Corporation of Santa Clara, California.

While the principles of the invention have now been made clear in the illustrated embodiment, it will be obvious to those skilled in the art that many modifications in structure, arrangement, elements and components can be made which are particularly adapted for specific environments and operation requirements without departing from these principles. The appended claims are therefore intended to cover and embrace any such modification, within the limits only of the true spirit and scope of the invention.

We claim:

1. In a power supply comprising an input circuit, an output circuit and switching means coupling the input and output circuits, means for determining the occurrence and location of a fault in the power supply including:

means connected to various elements of the power supply for outputting a voltage level signal representing the operating condition of the elements;

comparator means connected to each of said outputting means for comparing the voltage level signal outputted by said outputting means with a reference voltage level signal, each of said comparator means outputting first control signals representing the extent the voltage level signal varies with the reference voltage level signal;

logic circuit means connected to each of said comparator means for receiving said first control signals enabling said logic circuit means to output second control signals indicating the power supply element which has failed after a predetermined time period has elapsed;

priority encoding means connected to said logic circuit means for receiving a plurality of said second control signals, said encoding means outputting a signal pattern representing the element having the highest priority which has failed in response to receiving said second control signals;

means for displaying the signal pattern upon the outputting of the signal pattern by said encoding means;

and means for enabling said displaying means to display said signal pattern after the outputting of said signal pattern has occurred.

2. The power supply of claim 1 in which said displaying means includes storage means connected to said encoding means for storing the signal pattern outputted by said encoding means and a display member connected to said storage means for displaying the signal pattern upon the storing of the signal pattern in said storage means.

3. The power supply of claim 2 which further includes timing means connected to said display member and enabled upon the storing of said signal pattern in said storage means to generate a predetermined time period whereby the display member is disabled after the elapse of said predetermined time period.

4. The power supply of claim 3 which further includes an independent power source and switching means connected to said power source and to said display member and operated to connect said power source to said display member enabling the display member to display the signal pattern stored in said storage means.

5. In a power supply comprising an input circuit, an output circuit and transistor switching members coupling the input and output circuits when enabled, means for determining the occurrence and location of a fault in the power supply including:

feedback means connected to portions of the output circuit for outputting voltage signals representing the voltage level at said portions of the power supply;

a plurality of voltage comparators receiving said voltage signals for comparing the voltage signal with reference voltage signals, said comparators outputting first control signals representing the extent the voltage signals vary with the reference voltage signals;

bi-stable logic circuit means receiving said first control signals for generating second control signals locating the power supply element which has failed;

means responsive to the generation of said second control signals for generating a binary value identifying the power supply element which has failed;

latch means for storing the binary value, said latch means generating a third control signal disabling said power supply upon the storing of said binary value;

means connected to said latch means for displaying the binary value when enabled;

and timing means connected to said latch means and operated by said third control signal to enable said displaying means to display said binary value.

6. The power supply of claim 5 which further includes switch means for operating said timing means when actuated whereby sad displaying means is enabled to display said binary value.

7. The power supply of claim 6 in which said binary value generating means includes encoding means adapted to output a binary value in accordance with the second control signal received.

8. The power supply of claim 7 which further includes an independent power source connected to said switch means, said independent power source connected to said timing means upon actuation of said switch means enabling said timing means to operate said displaying means.

9. The power supply of claim 8 in which said timing means includes counter means adapted to output a predetermined count and clock generating means connected to said timing means for outputting an energizing signal to said display member during the time said counter means outputs said predetermined count.

10. The power supply of claim 9 in which said displaying means comprises an LED display member.

11. A method for locating a faulty component in a power supply comprising the steps of:

sensing the power level at a plurality of portions of the power supply;

continuously comparing the sensed power levels with a reference power level;

generating a signal indicating a faulty component in response to the determination that a predetermined comparison failure has occurred at the sensed portion of the power supply;

storing the signal indicating a faulty component;

establishing the priority of importance between the simultaneous occurrence of signals indicating two or more faulty components;

generating a binary value identifying the faulty component having the highest priority;

disabling the power supply in response to the generation of the binary value;

displaying the binary value for a first predetermined time period;

disabling the displaying of the binary value at the end of the first predetermined time period;

and actuating a switch to display the binary value for a second predetermined time period after the power supply has been disabled.

* * * * *